US006771784B2

(12) United States Patent
Murata

(10) Patent No.: US 6,771,784 B2
(45) Date of Patent: Aug. 3, 2004

(54) SUB WOOFER SYSTEM

(76) Inventor: Kenji Murata, 13-41, Ichibancho 2-chome, Tachikawa-shi, Tokyo 190-0033 (JP)

( * ) Notice: Subject to any disclaimer, the term of this patent is extended or adjusted under 35 U.S.C. 154(b) by 379 days.

(21) Appl. No.: 09/926,319

(22) PCT Filed: Feb. 19, 2001

(86) PCT No.: PCT/JP01/01159

§ 371 (c)(1), (2), (4) Date: Jan. 9, 2002

(87) PCT Pub. No.: WO01/62041

PCT Pub. Date: Aug. 23, 2001

(65) Prior Publication Data

US 2002/0141605 A1 Oct. 3, 2002

(30) Foreign Application Priority Data

Feb. 18, 2000 (JP) ........................................ 2000-40494

(51) Int. Cl.$^{7}$ ............................ H03G 5/00; H04R 5/02; H04R 29/00

(52) U.S. Cl. ......................... 381/111; 381/103; 381/98; 381/97; 381/99; 381/59; 381/307

(58) Field of Search ................................ 301/111, 116, 301/117, 103, 97, 98, 99, 307, 59

(56) References Cited

U.S. PATENT DOCUMENTS

| | | | | | |
|---|---|---|---|---|---|
| 4,100,371 | A | * | 7/1978 | Bayliff | 381/335 |
| 5,910,991 | A | * | 6/1999 | Farrar | 381/59 |
| 6,067,360 | A | * | 5/2000 | Kasai et al. | 381/1 |
| 6,332,026 | B1 | * | 12/2001 | Kuusama et al. | 381/17 |
| 6,546,298 | B1 | * | 4/2003 | Bull | 700/94 |
| 6,687,379 | B1 | * | 2/2004 | Thiel | 381/99 |

FOREIGN PATENT DOCUMENTS

| | | |
|---|---|---|
| JP | 61-244193 | 10/1986 |
| JP | 10-11078 | 1/1998 |
| JP | 10-284965 | 10/1998 |

* cited by examiner

*Primary Examiner*—Minsun Oh Harvey
*Assistant Examiner*—Laura A. Grier
(74) *Attorney, Agent, or Firm*—Westerman, Hattori, Daniels & Adrian, LLP

(57) ABSTRACT

A sub woofer system is constituted of a real time digital signal processing part 5 that includes an A/D converter 5*a*, a low pass filter block 5*b*, a delay block 5*c*, and a D/A converter block 5*d*, an analog power amplifier 6 and a speaker 7. The length of delay time of the delay block 5*c* is set so that the length of group delay time of the digital signal processing part 5 may equal an integral multiple of the length of time corresponding to one wavelength of the crossover point frequency between the digital signal processing part 5 and a main speaker 4. The signal processing is performed under the conditions that have been set as such. In this case, a construction is made up wherein the length of a group delay time produced in the digital type real time digital signal processing part can be set to a given value. By this construction, it is possible to provide a sub woofer system which can improve the phase interference between the main speaker and the sub woofer system at the crossover point between the two.

13 Claims, 6 Drawing Sheets

SUB WOOFER SYSTEM

BACKGROUND OF THE INVENTION

1. Field of the Invention

The present invention relates to a sub woofer system wherein a sub woofer, the output sound signal of that has been produced by digital signal processing involving therein a group delay, is connected to an analog audio reproduction system.

2. Description of the Related Art

In a speaker system of an audio reproduction system, in order to obtain the range of plentiful low sounds, it has hitherto been carried out to construct the speaker system by adding a sub woofer to a main speaker unit. Ordinarily, as the low pass filter used when adding the sub woofer, there is used an analog passive filter comprised of a coil, a capacitor, and a speaker, or an analog active filter comprised of an amplifier, a resistor, and a capacitor.

Generally, a voice band passed through the added sub woofer is set so as to cover from 40 to 200 Hz inclusive. Therefore, the voice band that come above that frequency band are eliminated by the low pass filter. As the low pass filter, there are two types, one of them is an analog type in which although no group delay occurs the phase varies with the filter gain, and the other is a digital type in which group delay occurs. Many of the low pass filters that have been generally adopted are the analog-type ones in which no group delay occurs.

However, in the low pass filter of analog type, when using one having a steep filter characteristic, the quality of sounds tend to be degraded. For this reason, it is said that the limitation upon the filter characteristic that can be practically used is to an extent of 24 db/oct.

Also, the followings are known, too. Namely, because of the filter characteristic of the analog type filter, the sound at the crossover frequency and the sounds whose frequencies are in the vicinity thereof within the inhibition band of the sub woofer remain to exist while being subjected to rotation of the phase. These residual sounds make phase interference with the sounds within the pass band of the main speaker. Resultantly, adding the sub woofer causes degradation of the quality of the sound range undertaken by the main speaker.

On the other hand, in the digital type in which group delay occurs, a filter characteristic that is 10 times or more steeper than that of the analog type can be realized at a real time by the use of a DSP (Digital Signal Processor) or a CPU. Namely, by using an FIR type or IIR type digital filter in which there is used the DSP or CPU, it is possible to realize a steep filter without being accompanied by a degradation in the quality of sound that would occur in the analog type low pass filter. The reason for this is as follows. Namely, because the sounds within the inhibition band of the sub woofer are rapidly attenuated, the interference between the sounds within the inhibition band of the sub woofer and the sounds within the pass band of the main speaker occurs only to a small degree. As a result of this, it is possible to prevent degradation in the quality of sound within the range of sound undertaken by the main speaker.

However, in the digital type, at the crossover point between the main speaker and the sub woofer, the sound at the point is output from both the sub woofer and the main speaker substantially in same quantity. Therefore, phase interference occurs between the two due to the group delay in a real time digital signal processing part of the sub woofer. This causes a problem that the quality of sound at this crossover point degrades.

SUMMARY OF THE INVENTION

The present invention has been made in view of the above and has an object to provide a sub woofer system which has a construction that enables arbitrarily setting the group delay time length in the digital type real time digital signal processing part to thereby enable improving a phase interference between a main speaker and the sub woofer at a crossover point.

To attain the above object, according to the present invention, there is provided a sub woofer system which is mainly characterized in that the sub woofer system comprises a real time digital signal processing part that includes an A/D converter block, a low pass filter block, a delay block, and a D/A converter block, an analog power amplifier, and a speaker, whereby processing in the digital signal processing part is executed by setting the delay time length in the delay block so that the group delay time length in the digital signal processing part may be equal to an integral multiple of the time length corresponding to one wavelength of a crossover point frequency between the sub woofer system and a main speaker.

The present invention, in the above-described construction, may be arranged to enable automatically setting the group delay time length and thereby enable manually minutely adjusting the set time length thereof. Also, in place of the above-described construction, the invention can be made up into the following construction, too.

Namely, a first example of the other constructions of the sub woofer system according to the invention is a sub woofer system (FIG. 2) having a construction comprising a real time digital signal processing part that includes an A/D converter block, a low pass filter block, a delay block, and a D/A converter block, an analog power amplifier, and a speaker. In the sub woofer system, the delay time length in the delay block is automatically set so that the group delay time length in the digital signal processing system may be equal, among the time lengths represented by integral-multiple values of the time length (e.g. 1/100 sec. in case of 100 Hz) corresponding to one wavelength of the crossover point frequency between the sub woofer and the main speaker, to the shortest time length that when the delay time length in the delay block is set to be zero is among the time lengths larger than the group delay time length, whereby the above-mentioned delay time length in the delay block is made manually minutely adjustable.

Also, a second example of the other constructions is a sub woofer system having a construction comprising a real time digital signal processing part that includes an A/D converter block, a low pass filter block, a delay block, and a D/A converter block, an analog power amplifier, and a speaker. In the sub woofer system, the delay time length in the delay block is automatically set so that the group delay time length in the digital signal processing system may be equal, among the time lengths represented by integral-multiple values of the time length (e.g. 1/100 sec. in case of 100 Hz) corresponding to one wavelength of the crossover point frequency between the sub woofer and the main speaker, to the shortest time length that when the delay time length in the delay block is set to be zero is among the time lengths larger than the group delay time length; and with respect to the delay time length, there is input as a manual operation, or a system operation, offset value the difference between the distance from a listener to the main speaker and the distance from the listener to the sub woofer, and this difference is calculated in terms of the time length, whereby the calculated result is reflected by the group delay time length, and simultaneously this calculated time length is made manually minutely adjustable. In the present invention, as the factor reflected by the group delay time length there is not only the difference in distance between the two speakers but also, in some cases, the difference between a phase angle of the main speaker itself and that of the sub woofer itself. Therefore, in the present invention, there is also a case where this difference in phase angle is calculated in terms of the time length and is reflected by the group delay time length.

In the sub woofer system of the present invention, the A/D converter block may be replaced with a digital audio interface block (DAI block), whereby it may be arranged that a digital signal transmitted from a reproduction medium such as a CD, a DVD, etc., a digital pre-amplifier, and a digital channel divider, etc. can be directly input to the sub woofer system.

Further, in the sub woofer system of the present invention, to the real time digital signal processing part, there is added an equalizer block for correcting to flatness the peaks and dips of the frequency response and/or phase response that is specific for a speaker unit used in the sub woofer or that is produced with a combination of the sub woofer and a speaker box, whereby, if necessary, the correction has its contents made manually minutely adjustable for producing a higher quality of sounds (FIG. 4).

Additionally, in the present invention, the equalizer block to be added is in some cases used as means for correcting to flatness the descent in a low-sound range and making this correction manually minutely adjustable. It should be noted that in the present invention, the power amplifier for use for the sub woofer can be replaced with an another arbitrary power amplifier. Further, in the present invention, in a sub woofer system having an arbitrary power amplifier and an arbitrary sub woofer in combination, the real time digital signal processing part is inserted to thereby construct the sub woofer system of the invention.

DETAILED DESCRIPTION OF THE PREFERRED EMBODIMENTS

Figure 1:
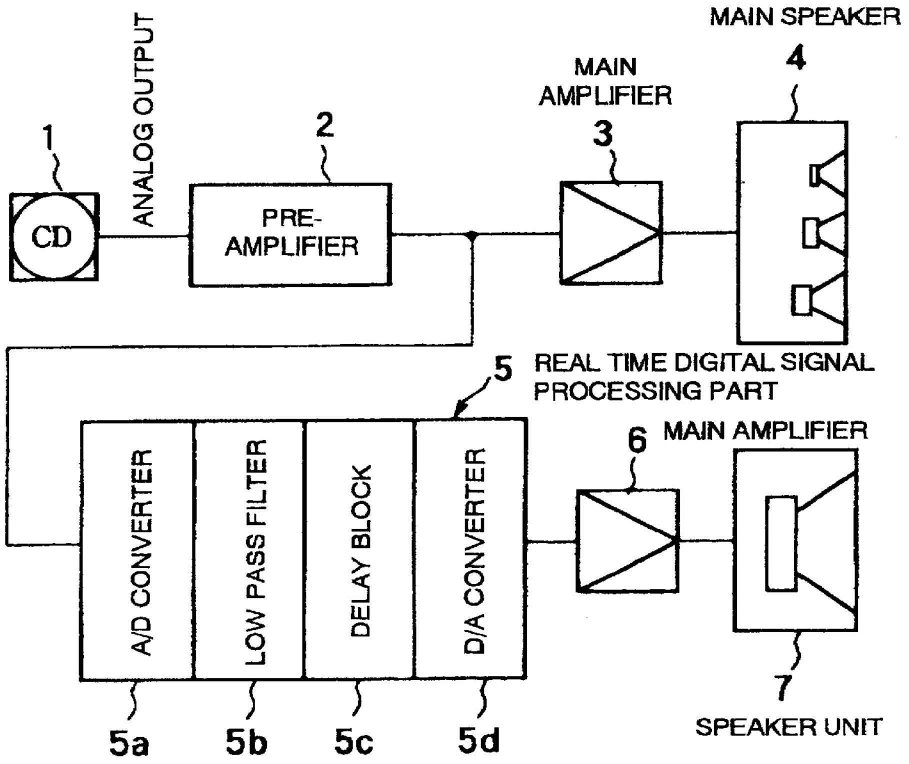
FIG. 1 is a block diagram showing an example wherein a sub woofer system according to the present invention is applied to an example of an existing audio system.
Figure 2:
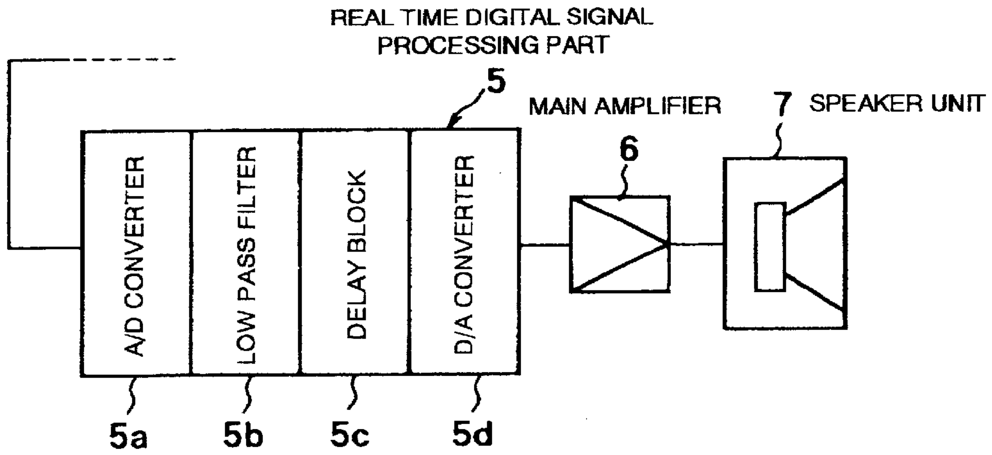
FIG. 2 is a block diagram showing an example of the sub woofer system according to the invention that is employed in FIG. 1.
Figure 3:
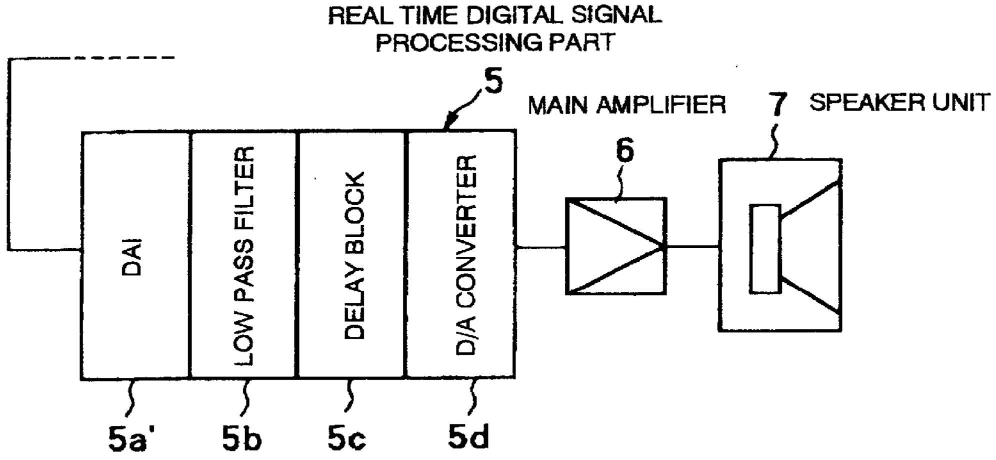
FIG. 3 is a block diagram illustrating another example of the sub woofer system according to the invention.
Figure 4:
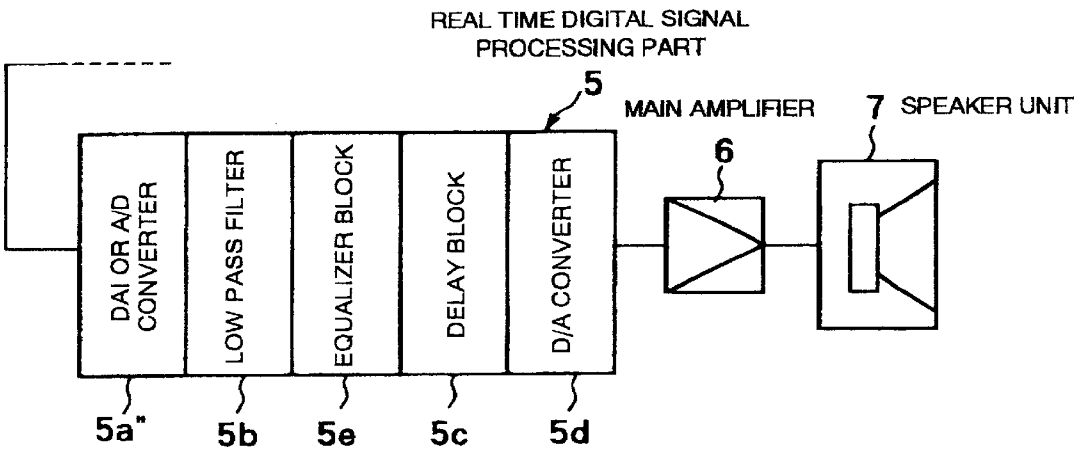
FIG. 4 is a block diagram illustrating still another example of the sub woofer system according to the invention.
Figure 5:
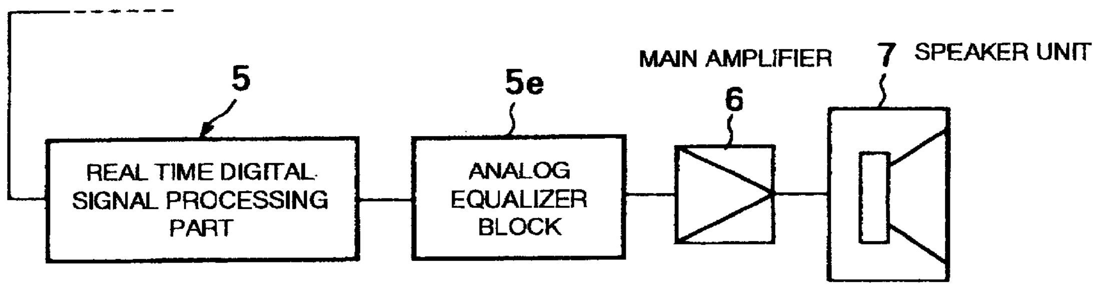
FIG. 5 is a block diagram illustrating a further example of the sub woofer system according to the invention.
Figure 6:
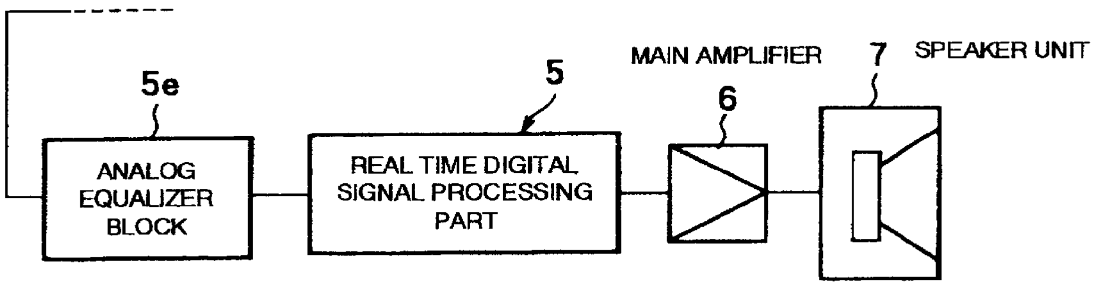
FIG. 6 is a block diagram illustrating a yet further example of the sub woofer system according to the invention.

Next, embodiments of the present invention will be explained with reference to the accompanying drawings. FIG. 1 is a block diagram showing an example wherein a sub woofer system according to the invention is applied to one example of an existing audio system. FIG. 2 is a block diagram showing an example of the sub woofer system according to the invention that is employed in FIG. 1. FIG. 3 is a block diagram illustrating another example of the sub woofer system according to the invention. FIG. 4 is a block diagram showing still another example of the woofer system according to the invention. And, FIGS. 5 and 6 are block diagrams showing further examples of the woofer system according to the invention.

In FIG. 1, a reference numeral 1 denotes a playback detection part for an audio signal recorded in a recording medium such as a CD, a reference numeral 2 denotes a pre-amplifier connected to the detection part 1, a reference numeral 3 denotes a main amplifier connected to the pre-amplifier, and a reference numeral 4 denotes a main speaker that is connected to the main amplifier 3 and that is of a multi-way type in the figure. A system including every element from the playback detection part 1 to the main speaker 4 constitutes an example of a conventionally known audio system.

By being inserted into and added to the audio system, the sub woofer system of the invention is intended to obtain a reproduction low sound with an ample feeling of presence that cannot be obtained with the conventional analog type sub woofer system. That sub woofer system has the following construction.

In FIG. 1, a reference numeral 5 denotes a real time digital signal processing part that handles a reproduction signal, which has been branched off from the pre-amplifier 2 in the above-described audio system, as an analog input signal to be processed thereby. The real digital signal processing part includes the following elements. Namely, a reference numeral 5*a* denotes an A/D converter that converts an analog audio signal, which is branched off and supplied from the pre-amplifier 2, to a digital signal, a reference numeral 5*b* denotes a digital low pass filter that, of the digital audio signals supplied from the converter 5*a*, permits the passage therethrough of only a digital audio signal having a frequency of, for example, 200 Hz or less and that inhibits the passage therethrough of a signal the frequency of that comes under the other frequency band, a reference numeral 5*c* denotes a delay block, a reference numeral 5*d* denotes a D/A converter that converts a digital audio signal, which has had its phase controlled by the delay block 5*c*, to an analog audio signal, a reference numeral 6 denotes a main amplifier of the sub woofer system of the invention, and a reference numeral 7 denotes a speaker unit that serves as a sub woofer. Here, as the low pass filter, although either an FIR type or an IIR type is used, the FIR type filter is more preferable.

In the above-described digital low pass filter 5*b*, because performing digital processing of a digital audio signal, a very steep filter characteristic is obtained. In addition, in the case of the FIR type filter, it can be made up into a construction of linear phase in which no phase rotation occurs as in the case of an analog type filter. However, in the A/D converter 5*a*, low pass filter 5*b*, and D/A converter 5*d*, delay not only occurs when conversions by the both converters are made but, because a length of time is needed for performing digital processing of the signal, group delay also occurs. As a result of this, a time difference occurs between the resulting reproduction signal and the reproduction signal output from the main-speaker system.

On this account, in the present invention, the variable type delay block 5*c* is inserted immediately after the low pass filter 5*b*. Thereby, the group delay in the filter 5*b* and the converters 5*a* and 5*d* is phase controlled there in terms of between the resulting reproduction signal and the reproduction signal from the main-speaker system. The present invention thereby has enabled a reproduction sound in the range of low sound, which when listening they don't feel that it has a phase shift occurring due to the group delay, to be superimposed upon the reproduction sound of the main speaker 4.

Namely, assume that the crossover point between the woofer of the main speaker 4 and the sub woofer 7 is, for example, 100 Hz. In the delay block 5*c*, then, a delay (with respect to the analog signal of the main speaker) is produced by the operation of the delay block 5*c* so that the total length of group delay time in the real time digital signal processing part may become a length of time of 1/100 sec. corresponding to one wavelength of the 100-Hz frequency, or an integral multiple thereof. The delay block 5*c* thereby drives the sub woofer 7 by the main amplifier 6 thorough the D/A converter 5*d*.

When adopting this method of reproduction, even if all of the sounds made by and from a low-sound musical instrument have been played back from the main speaker 4 and thereafter only the sounds in the low-sound range thereof are added to those sounds from the sub woofer 7, a human has no unnatural feeling with respect to the resulting tone. The reason for this is as follows. Namely, it is said that in a human auditory sense the resolving power in the low-sound range is lower than that in the intermediate-sound range. And, the sequential order in which a human recognizes the sounds in the low-sound range made by a musical instrument and the like is that first he discriminates the harmonic sounds. Next, he would rather feel the sounds in the low-sound range with his own body as a whole than with his ears. Accordingly, even when the harmonic in the low-sound range is first played back from the main speaker 4 and then the sounds in the low-sound range in the sub woofer system, the phases of which have been controlled there, are additionally played back from the sub woofer 7, if the sound range is low, the human auditory sense cannot virtually discriminate the time difference actually existing between the harmonic in the low-sound range that comes out from the main speaker 4 and the sounds in the low-sound range that come out from the sub woofer 7.

FIG. 2 is a block diagram illustrating an arrangement in which only the sub woofer system of the invention of FIG. 1 is extracted. The signal input to the A/D converter 5*a* may be taken in from other position than that of the pre-amplifier 2 of FIG. 1. However, the A/D converter 5*a* cannot directly take in a digital signal such as that recorded in a CD or a DVD. Therefore, when directly taking in a digital signal, as illustrated in FIG. 3, a digital audio interface block (DAI block) 5*a*' is used in place of the A/D converter 5*a*. Also, although the low pass filter block 5*b*, equalizer 5*e*, and delay block 5*c*, for brevity of explanation, are illustrated in their divided forms, the respective pieces of processing in the DSP 5 are ordinarily performed at the same time. Such pieces of processing may of course be performed at individually separate times.

The present invention is as has been described above. Namely, in the sub woofer system that performs real time digital signal processing, group delay occurs during a time period of digital signal processing, and phase interference occurs due to this group delay in the vicinity of a crossover point between the system and the main speaker. On this account, on the other hand, a delay block is inserted into this real time digital signal processing system. Thereby, it is arranged to perform control of the length of a group delay time occurring in the digital signal processing system so that this length may equal an integral multiple of the length of time corresponding to one wavelength of the crossover point frequency signal between the system and the main speaker. By this control, the phase interference can be prevented from occurring. Therefore, it is possible to provide a sub woofer system that plays back a plentiful low-range sound that when listening to the person has no feeling of unnaturalness and therefore a very ample feeling of presence. Incidentally, even with use of the system according to the invention, the phases in an ultra-low sound range, the frequency of that is lower than the crossover point frequency, cannot be matched with each other. However, compared to the conventional analog type sub woofer system wherein phase interference occurred over a range of sounds that includes the sound at the crossover point frequency and every sound from the pitch approximately ½ octave higher than this crossover point to the pitch approximately ½ octave lower than it, the invention brings about the effect of widening the matched-phase range of sounds to a range from the pitch approximately 1 octave above the crossover point to the pitch approximately 1 octave below the same. Also, using the FIR filter of linear phase, the frequencies of the sounds the pitches of that are below the pitch of the crossover frequency sound can be further sectioned into narrower bands, whereby the phases in the respective bands can be matched between such bands. It is thereby possible to further widen the range of sounds within which no phase interference occurs and they are heard as if having the same phase.

What is claimed is:

1. A sub woofer system comprising a real time digital signal processing part that includes an A/D converter block, a low pass filter block, a delay block, and a D/A converter block, an analog power amplifier, and a speaker, whereby processing in the digital signal processing part is executed by setting the delay time length in the delay block so that the group delay time length in the digital signal processing part may equal an integral multiple of the time length corresponding to one wavelength of a crossover point frequency signal between the sub woofer system and a main speaker.

2. A sub woofer system according to claim 1, wherein as the low pass filter there is used an FIR (Finite Impulse Response) type or IIR (Infinite Impulse Response) type, based on the use of a DSP (Digital Signal Processor), or a hybrid type digital filter comprised of the FIR and IIR type digital filters.

3. A sub woofer system according to claim 1 or 2, wherein, regarding the group delay time length in the digital signal processing part to be set, the delay time length in the delay block is automatically set so that the group delay time length in the digital signal processing part may equal, among the time lengths represented by integral-multiple values of the time length corresponding to one wavelength of the crossover point frequency signal between the sub woofer and the main speaker, the shortest time length that when the delay time length in the delay block is set to be zero is among the time lengths larger than the group delay time length, whereby said delay time length in the delay block is made manually minutely adjustable.

4. A sub woofer system, wherein with respect to the delay time length set in claim 1 or 2 there is input as a manual operation, or a system operation, offset value (an initial value) the difference between the distance from a listener to the main speaker and the distance from the listener to the sub woofer, and this difference is calculated in terms of the time length, whereby the calculated result is reflected by said group delay time length and simultaneously this calculated time length is made manually minutely adjustable.

5. A sub woofer system, wherein with respect to the delay time length set in claim 1 or 2 there is input as a manual operation, or a system operation, offset value the difference between the phase angle of the main speaker itself and that of the sub woofer itself at the crossover point, and this difference is calculated in terms of the time length, whereby the calculated result is reflected by said group delay time length and simultaneously this calculated time length is made manually minutely adjustable.

6. A sub woofer system, wherein the A/D converter block as described in claim 1 or 2 is changed to a digital audio interface block, whereby it is arranged that a digital signal transmitted from one of a reproducer of a CD, a DVD, a digital pre-amplifier, or a digital channel divider, can be directly input to the sub woofer system.

7. A sub woofer system according to claim 1 or 2, wherein the D/A converter block is changed to a digital audio interface block; and the analog power amplifier is replaced with a digital power amplifier.

8. A sub woofer system, wherein to the real time digital signal processing part as described in claim 1 or 2, there is added an equalizer block for making flat or correcting to a characteristic suitable for the sub woofer the peaks and dips of the frequency response and/or phase response that is specific for a sub woofer unit or that is produced with a combination of the sub woofer unit and a speaker box.

9. A sub woofer system, wherein the correction of claim 8 has its contents made manually minutely adjustable for producing a higher quality of sounds.

10. A sub woofer system, wherein to the real time digital signal processing part as described in claim 1 or 2, there is added an equalizer block for correcting to flatness the descent in a low-sound range in the frequency response that is specific for a sub woofer unit or that is produced with a combination of the sub woofer unit and a speaker box.

11. A sub woofer system, wherein the equalizer block of claim 10 is also provided before the A/D converter, or after the D/A converter, as an analog block.

12. A sub woofer system, wherein in place of the power amplifier for use for the sub woofer as described in claim 1 or 2 arbitrary power amplifiers are used in combination.

13. A sub woofer system wherein, the real time digital signal processing part as described in claim 1 or 2 is used in a sub woofer system having an arbitrary power amplifier and an arbitrary sub woofer in combination.

* * * * *